(12) United States Patent
Chang et al.

(10) Patent No.: US 11,404,315 B2
(45) Date of Patent: Aug. 2, 2022

(54) METHOD FOR MANUFACTURING SEMICONDUCTOR DEVICE

(71) Applicant: TAIWAN SEMICONDUCTOR MANUFACTURING CO., LTD., Hsinchu (TW)

(72) Inventors: Chia-Hao Chang, Hsinchu (TW); Jia-Chuan You, Taoyuan (TW); Yu-Ming Lin, Hsinchu (TW); Chih-Hao Wang, Hsinchu County (TW); Wai-Yi Lien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 82 days.

(21) Appl. No.: 16/871,983

(22) Filed: May 11, 2020

(65) Prior Publication Data
US 2020/0273748 A1  Aug. 27, 2020

Related U.S. Application Data

(62) Division of application No. 15/719,395, filed on Sep. 28, 2017, now Pat. No. 10,651,085.

(51) Int. Cl.
| | | |
|---|---|---|
| *H01L 21/336* | (2006.01) | |
| *H01L 21/768* | (2006.01) | |
| *H01L 23/535* | (2006.01) | |
| *H01L 23/528* | (2006.01) | |
| *H01L 29/78* | (2006.01) | |
| *H01L 29/66* | (2006.01) | |
| *H01L 29/08* | (2006.01) | |
| *H01L 29/165* | (2006.01) | |

(52) U.S. Cl.
CPC .. *H01L 21/76895* (2013.01); *H01L 21/76805* (2013.01); *H01L 21/76816* (2013.01); *H01L 21/76831* (2013.01); *H01L 23/528* (2013.01); *H01L 23/535* (2013.01); *H01L 29/66545* (2013.01); *H01L 29/66636* (2013.01); *H01L 29/7848* (2013.01); *H01L 29/0847* (2013.01); *H01L 29/165* (2013.01)

(58) Field of Classification Search
CPC .............. H01L 21/76805; H01L 21/76895
See application file for complete search history.

(56) References Cited

U.S. PATENT DOCUMENTS

| | | | |
|---|---|---|---|
| 2016/0343825 A1 | 11/2016 | Bae et al. | |
| 2016/0379925 A1* | 12/2016 | Ok | H01L 21/76802 |
| | | | 257/288 |
| 2017/0053997 A1 | 2/2017 | Cheng et al. | |

\* cited by examiner

*Primary Examiner* — Samuel A Gebremariam
(74) *Attorney, Agent, or Firm* — Maschoff Brennan

(57) ABSTRACT

A method of forming a semiconductor device includes forming an ILD structure over a source/drain region, forming a source/drain contact in the ILD structure and over the source/drain region, removing a portion of the source/drain contact such that a hole is formed in the ILD structure and over a remaining portion of the source/drain contact, forming a hole liner lining a sidewall of the hole after removing the portion of the source/drain contact, and forming a conductive structure in the hole.

20 Claims, 8 Drawing Sheets

METHOD FOR MANUFACTURING SEMICONDUCTOR DEVICE

PRIORITY CLAIM AND CROSS-REFERENCE

This application is a division application of U.S. application Ser. No. 15/719,395, filed on Sep. 28, 2017, now U.S. Pat. No. 10,651,085, issued May 12, 2020, the entirety of which is incorporated by reference herein in their entireties.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
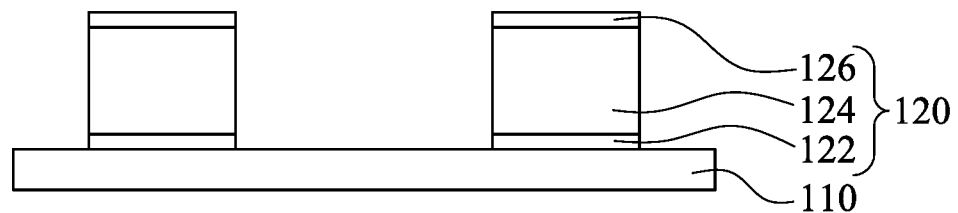
FIG. 1 to FIG. 16 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins in FinFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 16 are cross-sectional views of a method for manufacturing a semiconductor device at various stages in accordance with some embodiments of the present disclosure.

Reference is made to FIG. 1. A semiconductor substrate 110 is provided. In some embodiments, the semiconductor substrate 110 may be a semiconductor fin protruding from a substrate. Gate structures 120 are formed on the semiconductor substrate 110. In some embodiments, the semiconductor substrate 110 includes silicon. Alternatively, the semiconductor substrate 110 may include germanium, silicon germanium, gallium arsenide or other appropriate semiconductor materials. Also alternatively, the semiconductor substrate 110 may include an epitaxial layer. Further, the semiconductor substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Furthermore, the semiconductor substrate 110 may include a semiconductor-on-insulator (SOI) structure. Also alternatively, the semiconductor substrate 110 may include a buried dielectric layer, such as a buried oxide (BOX) layer, such as that formed by separation by implantation of oxygen (SIMOX) technology, wafer bonding, or other appropriate method. In some embodiments, the semiconductor substrate 110 includes silicon. The semiconductor substrate 110 may be a semiconductor fin protruding from a substrate.

In some embodiments, the gate structures 120 can serve as a dummy gate structure and at least portions thereof will be replaced with a replacement gate structure using a "gate-last" or replacement-gate process. For example, the dummy gate structures 120 may be replaced later by metal gate electrodes (MG) after high temperature thermal processes, such as thermal annealing for source/drain activation during the sources/drains formation. In other embodiments, the gate structures 120 are active gates and are formed in a "gate-first process" and will not be replaced.

The gate structures 120 can be formed by deposition and patterning. In some embodiments, the gate structures 120 each include a gate dielectric layer 122, a dummy gate electrode 124 with an overlaying mask layer 126. The gate dielectric layer 122 is blanket deposited on the semiconductor substrate 110 by a suitable technique, such as thermal oxidation, chemical vapor deposition (CVD), physical vapor deposition (PVD), atomic layer deposition (ALD), sputtering, other suitable processes, or combinations thereof. In some embodiments, the gate dielectric layer 122 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 122 may have a multilayer structure such as one layer of silicon oxide (e.g., interfacial layer) and another layer of high-k material.

The dummy gate electrode 124 is deposited on the gate dielectric layer 122 by a suitable technique, such as thermal oxidation, chemical vapor deposition (CVD), physical vapor deposition (PVD), atomic layer deposition (ALD), sputtering, other suitable processes, or combinations thereof. In some embodiments, the dummy gate electrode 124 may include polycrystalline-silicon (poly-Si), poly-crystalline silicon-germanium (poly-SiGe), metallic nitrides, metallic silicides, metallic oxides, or metals. In some embodiments, the dummy gate electrode 124 may include a metal-containing material such as TiN, TaN, TaC, Co, Ru, Al, combinations thereof, or multi-layers thereof.

The mask layer 126, such as photoresists, hard masks, combinations thereof, or multi-layers thereof, may be formed over the dummy gate electrode 124. Then, the mask layer 126 is patterned by a lithography process and an etching process, thereby forming openings in the mask layer 126, exposing the underlying dummy gate electrode layer within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). Another etching process is applied to the dummy gate electrode layer and the gate dielectric layer through the openings of the mask layer 126, thereby forming the dummy gate structures 120 straddling portions of the semiconductor substrate 110 as shown in FIG. 1, if the semiconductor substrate 110 is a semiconductor fin.

Figure 2:
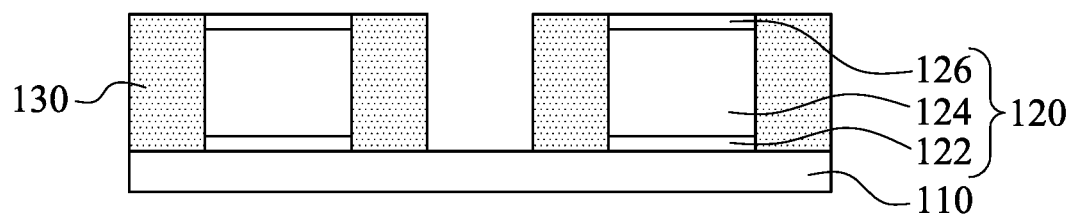

Reference is made to FIG. 2. Gate spacers 130 are formed on sidewalls of the gate structures 120. In some embodiments, the gate spacers 130 may include silicon oxide, silicon nitride, silicon oxynitride, silicon carbide, silicon carbonitride, silicon oxycarbonitride, silicon oxycarbide or other suitable material. The gate spacers 130 may include a single layer or multilayer structure. To form the gate spacers 130, a blanket layer may be formed on the semiconductor substrate 110 by CVD, PVD, ALD, or other suitable technique. In some embodiments, the gate spacers 130 are used to offset subsequently formed doped regions, such as source/drain regions. The gate spacers 130 may further be used for designing or modifying the source/drain region (junction) profile.

Figure 3:
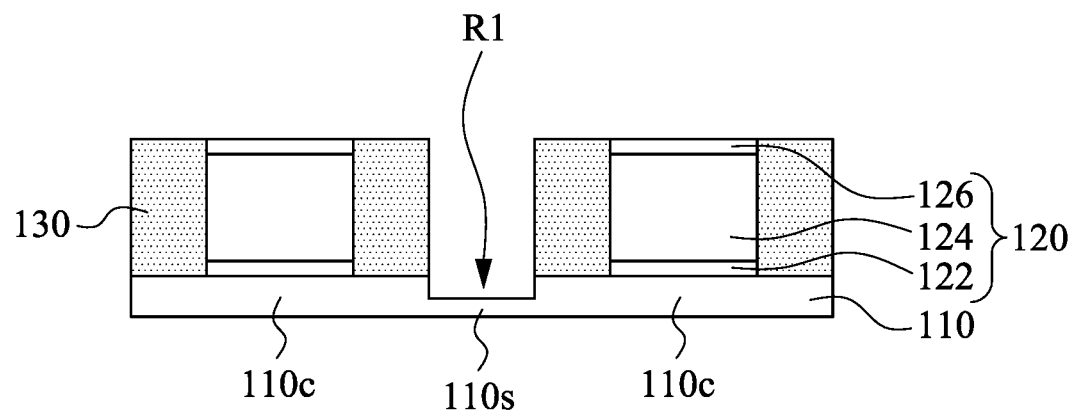

Reference is made to FIG. 3. At least one portion of the semiconductor substrate 110 uncovered by the gate structure 120 and the gate spacers 130 is removed (or recessed) to form at least one source/drain recess R1 in the semiconductor substrate 110. A remaining portion of the semiconductor substrate 110 has at least one source/drain portion 110s and channel portions 110c. The channel portions 110c underlie the gate structures 120, and the source/drain portion 110s is not covered by the dummy gate structures 120 and the gate spacers 130.

Figure 4:
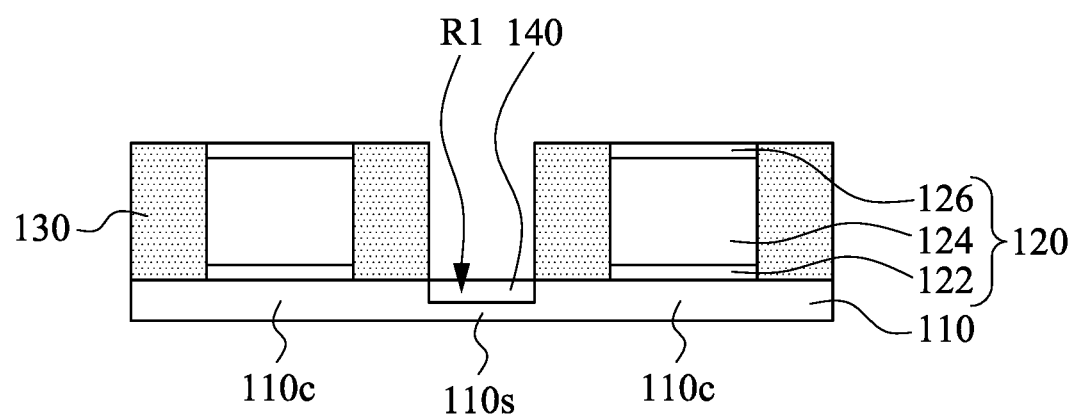

Reference is made to FIG. 4. At least one epitaxy feature 140 (also referred to as a source/drain region) is formed within the recess R1 and on the source/drain portions 110s of the semiconductor substrate 110. In some embodiments, the epitaxy feature 140 may be formed using one or more epitaxy or epitaxial (epi) processes, such that Si features, SiGe features, SiP features, and/or other suitable features can be formed in a crystalline state on the source/drain portion 110s of the semiconductor substrate 110. In some embodiments, the lattice constant of the epitaxy feature 140 is different from the lattice constant of the semiconductor substrate 110, so that the channel portions 110c of the semiconductor substrate 110 can be strained or stressed by the epitaxy feature 140 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor substrate 110.

Figure 5:
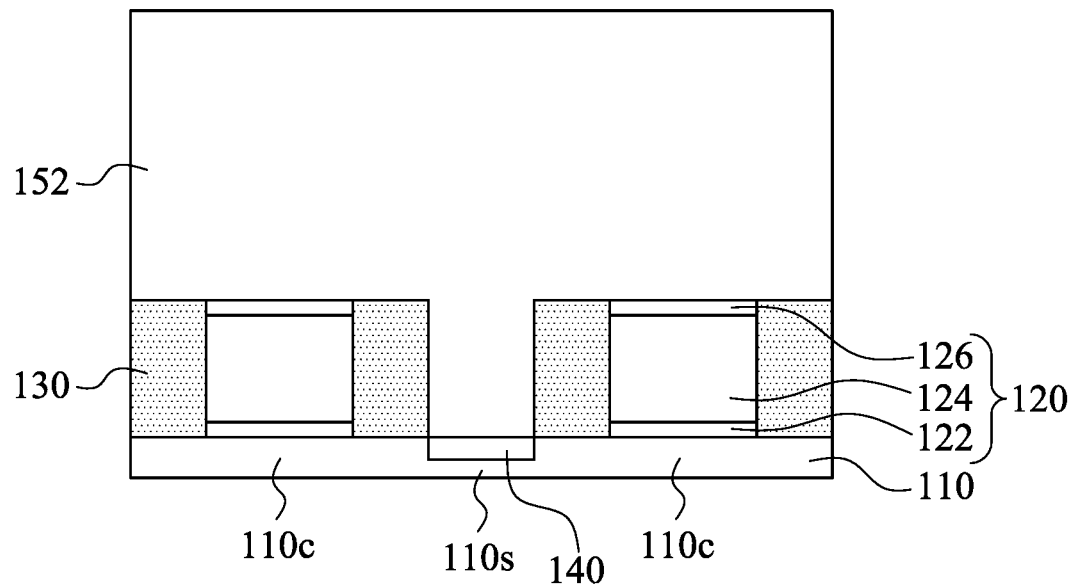
Figure 6:
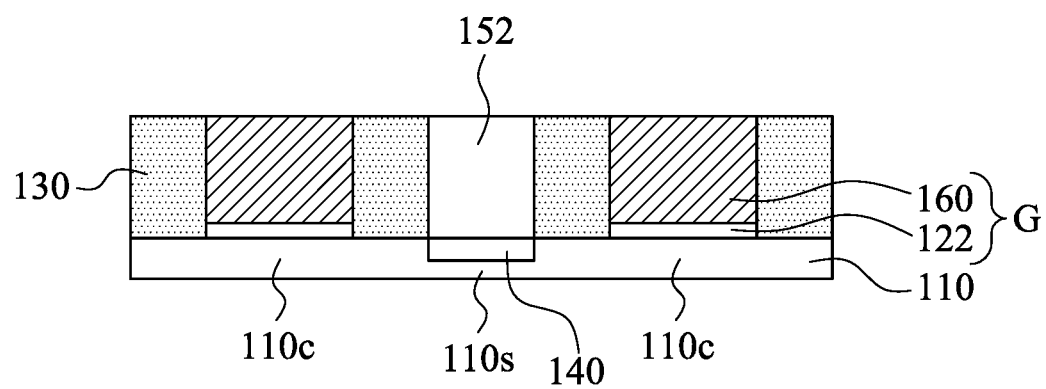

Reference is made to FIG. 5. A first inter-layer dielectric (ILD) layer 152 is formed over the semiconductor substrate 110. The first ILD layer 152 includes silicon oxide, silicon nitride, silicon oxynitride, silicon carbide, low-dielectric constant dielectric material or a combination thereof. The first ILD layer 152 includes a single layer or multiple layers. The first ILD layer 152 is formed by a suitable technique, such as CVD. Subsequently, a chemical mechanical planarization (CMP) process is applied to remove excessive first ILD layer 152 until the mask layer 126 is removed, and the resulting structure is shown in FIG. 6. In other words, the first ILD layer 152 is removed to expose a top surface of the dummy gate electrodes 124 for a subsequent gate replacement process.

Thereafter, the gate replacement process is performed to replace the dummy gate structures 120 with gate electrodes 160 (or gate conductors) respectively. More particularly, dummy gate electrodes 124 of the dummy gate structures 120 (as shown in FIG. 5) are removed to form gate trenches with the gate spacers 130 as their sidewalls, and the gate electrodes 160 are formed in the gate trenches respectively. In some embodiments, the gate dielectric layers 122 are removed as well. The dummy gate electrodes 124 may be removed by dry etch, wet etch, or a combination of dry and wet etch. For example, a wet etch process may include exposure to a hydroxide containing solution (e.g., ammonium hydroxide), deionized water, and/or other suitable etchant solutions.

In some embodiments, one of the gate electrodes 160 and one of the underlying gate dielectric layers 122 can be collectively referred to as a gate stack G, as shown in FIG. 6. The gate stacks G straddle the semiconductor substrate 110 and extend along the gate spacers 130, if the semiconductor substrate 110 is formed as a semiconductor fin. In some embodiments, one of the gate electrodes 160 includes a work function conductor and a filling conductor in a recess of the work function conductor. For example, the work function conductor of the gate electrodes 160 may include one or more n-type work function metals (N-metal), such as titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. Alternatively, the work function conductor may include one or more p-type work function metals (P-metal), such as titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the filling conductor of the gate electrodes 160 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 7:
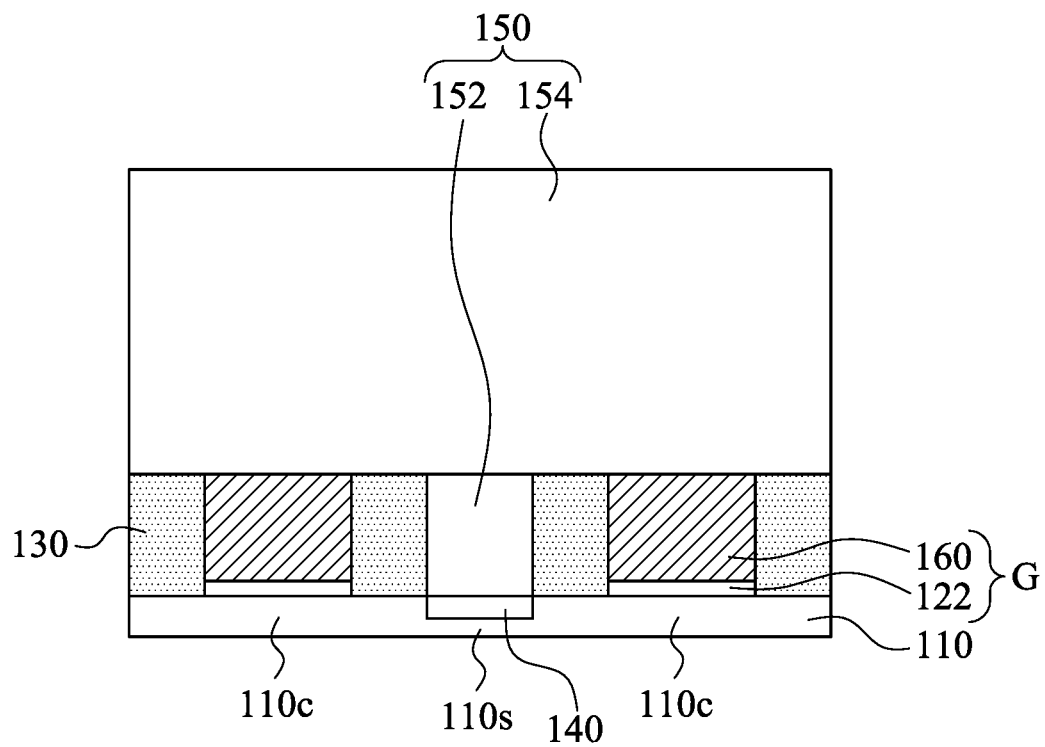

Reference is made to FIG. 7. A second ILD layer 154 is formed on the first ILD layer 152 and the gate electrode 160. The first ILD layer 152 and the second ILD layer 154 can be collectively referred to as an ILD structure 150. The second ILD layer 154 may include substantially the same materials as first ILD layer 152 in some embodiments. In some embodiments, the first and second ILD layers 152 and 154 have different dielectric materials. In some embodiments, the second ILD layer 154 includes silicon oxide, silicon nitride, silicon oxynitride, silicon carbide, low-dielectric constant dielectric material or a combination thereof. The second ILD layer 154 includes a single layer or multiple layers. The second ILD layer 154 is formed by a suitable technique, such as CVD.

Figure 8:
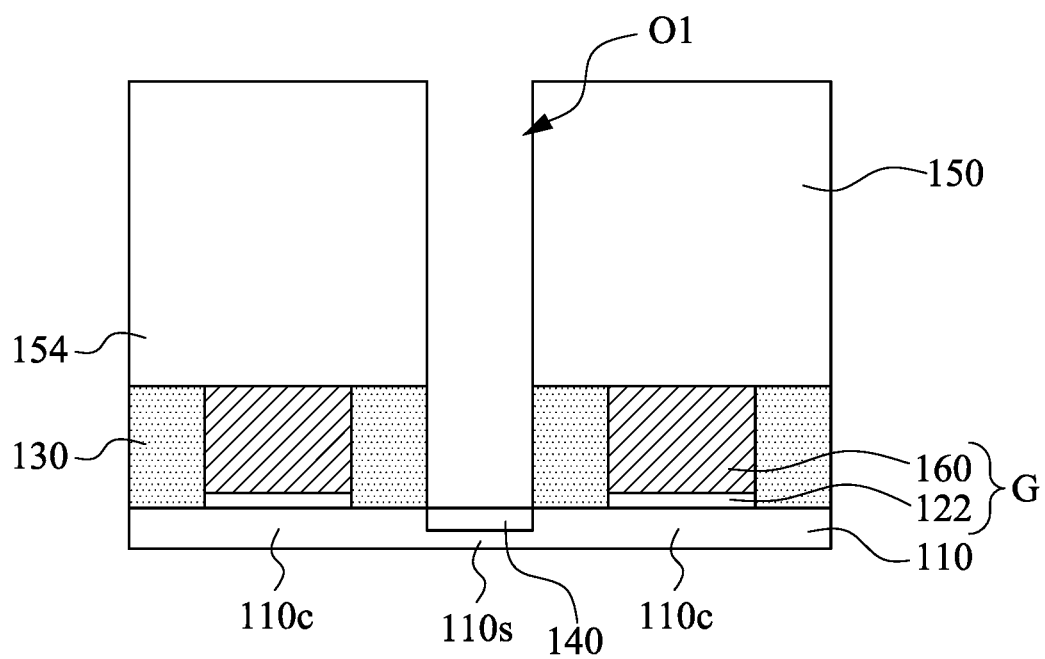

Reference is made to FIG. 8. A source/drain contact hole O1 is formed in the ILD structure 150 to expose a portion of the epitaxy feature 140. In some embodiments, the source/drain contact hole O1 is etched in the second and first ILD layers 154 and 152 until reaching the epitaxy feature 140. In some embodiments, the source/drain contact hole O1 may be formed, for example, by patterning and etching the ILD structure 150 using photolithography techniques. For example, a layer of photoresist material (not shown) is deposited over the ILD structure 150. The layer of photoresist material is irradiated (exposed) in accordance with a desired pattern (the source/drain contact hole O1 in this case) and developed to remove portions of the photoresist material. The remaining photoresist material protects the underlying material from subsequent processing steps, such as etching. The etching process, such as a dry etching, wet etching, and/or plasma etching process, is performed to remove portions of the first ILD layer 152 and the second ILD layer 154. In some embodiments, the etching process may be, but not limited to be, anisotropic etching. In some other embodiments, the source/drain contact hole O1 is etched in the first and second ILD layers 152 and 154 until reaching the epitaxy feature 140.

Figure 9:
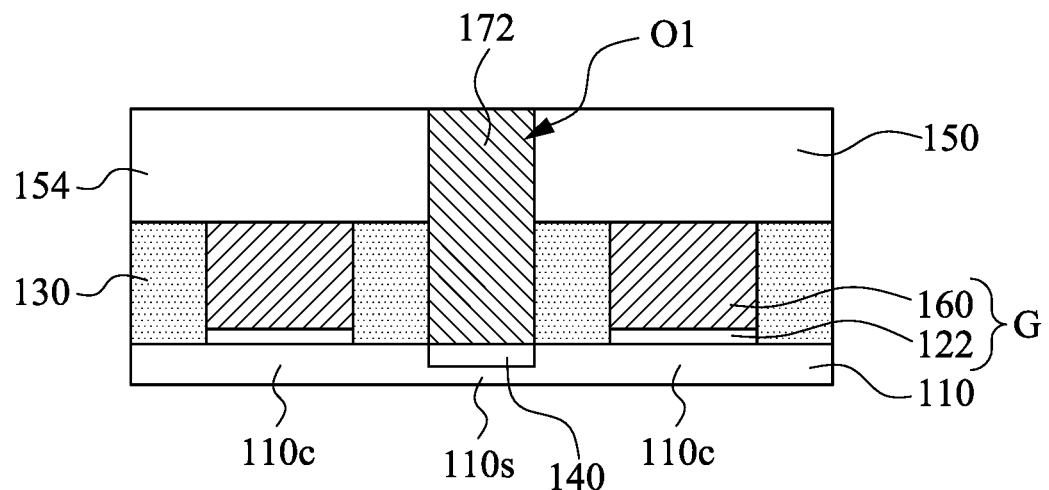

Next, a source/drain contact 172 is formed in the source/drain contact hole O1 and is in contact with the epitaxy feature 140, and a CMP process is carried out to planarize the source/drain contact 172 with the second ILD layer 154. The resulting structure is shown in FIG. 9. Exemplary formation method of the source/drain contact 172 may include depositing metal or other suitable conductive materials in the source/drain contact hole O1 using a deposition process, such as a CVD process.

Figure 10:
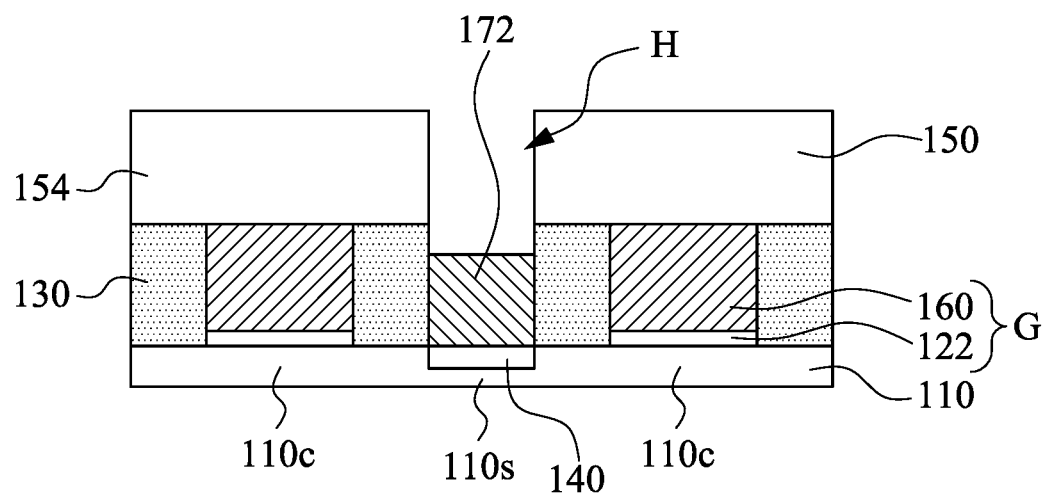

FIG. 10 illustrates etching back the source/drain contact 172. Herein, the etching back process is selective to the source/drain contact 172. To be specific, the second ILD layer 154 has higher etch resistance to the etching back than that of the source/drain contact 172, such that a top surface of the etched back source/drain contact 172 is lower than that of the second ILD layer 154 after the etching back. As a result of the etching back process, a hole H is formed in the second ILD layer 154 and over the source/drain contact 172. In some embodiments, the source/drain contact 172 is etched back such that the top surface of the resulting source/drain contact 172 is lower than the top surfaces of the gate electrodes 160. For example, the source/drain contact 172 is selectively etched back until reaching a position lower than top surfaces of gate electrodes 160 proximate the epitaxy feature 140. In some embodiments, after the source/drain contact 172 is etched back, upper portions of sidewalls of the gate spacers 130 are exposed by the hole H.

Figure 11:
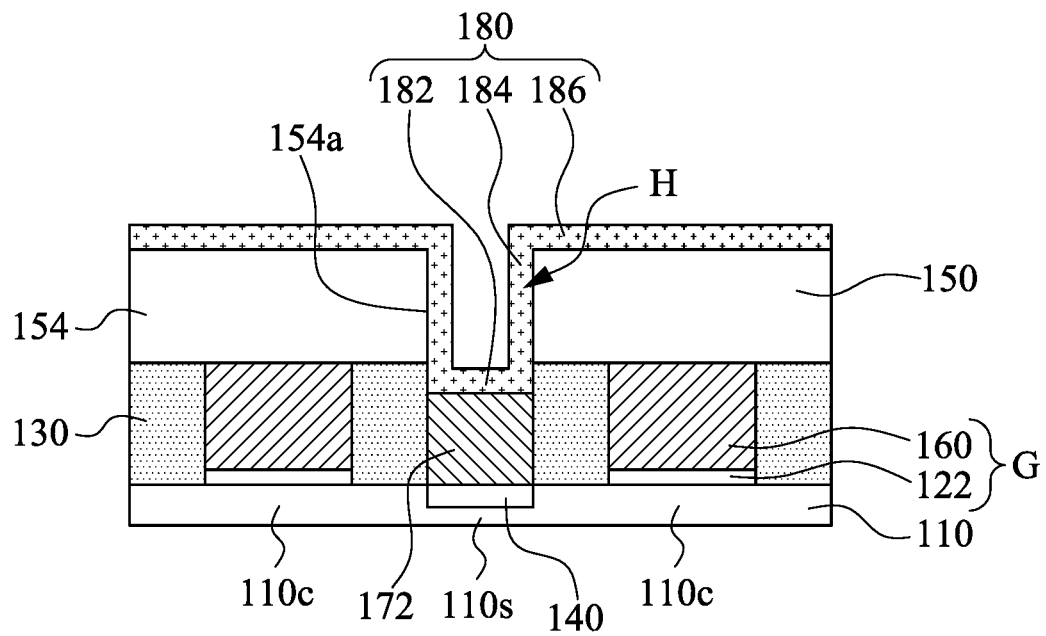

Reference is made to FIG. 11. A dielectric layer 180 is formed in the hole H. The dielectric layer 180 conformally lines the sidewall 154a of the second ILD layer 154 and the top surface of the source/drain contact 172. The dielectric layer 180 includes a bottom horizontal portion 182, a hole liner 184, and a top horizontal portion 186 monolithically connected to each other. The bottom horizontal portion 182 is in contact with the top surface of the source/drain contact 172, and the top horizontal portion 186 is in contact with a top surface of the second ILD layer 154. The hole liner 184 is in contact with the sidewall 154a of the second ILD layer 154 in the hole H. The hole liner 184 can be referred to as a dielectric liner in some embodiments. In some embodiments, the dielectric layer 180 may be formed in the hole H by a suitable technique, such as chemical vapor deposition (CVD), physical vapor deposition (PVD), atomic layer deposition (ALD) other suitable processes, or combinations thereof. In some embodiments, the dielectric layer 180 may include dielectric materials such as SiN, SiC, SiCN, SiON, AlO, AlON, ZrO, ZrN, the like or combinations thereof. A thickness of the dielectric layer 180 may range from about 1 nm to about 5 nm. In some embodiments, the portions of the gate spacers 130 exposed by the hole H are in contact with the dielectric layer 180.

A thickness of the dielectric layer 180 may be in a range from 1 nanometer to 5 nanometers. In some embodiments, the dielectric layer 180 may be formed under a pressure in a range of 1 mTorr to 10 mTorr and in a suitable temperature range. For example, in some embodiments, a SiN layer is formed in the temperature range from about 250° C. to about 500° C. with a precursor of dichlorosilane (DCS)/NH$_3$. In some embodiments, a SiC layer is formed in the temperature range from about 200° C. to about 450° C. with a Si—C contained precursor, such as tetramethylsilane (TMS). In some embodiments, a SiON layer is formed in the temperature range from about 200° C. to about 450° C. with a precursor of SiH$_4$/N$_2$O. In some embodiments, a SiCN layer is formed in the temperature range from about 200° C. to about 450° C. with a precursor of Si—C contained reaction gas. In some embodiments, a AlO/AlON layer is formed in the temperature range from about 200° C. to about 400° C. with a precursor of trimethylaluminum (TMA)/H$_2$O. In some embodiments, a ZrO/ZrN layer is formed in the temperature range from about 200° C. to about 400° C. with a precursor of ZrCl$_4$/H$_2$O.

Figure 12:
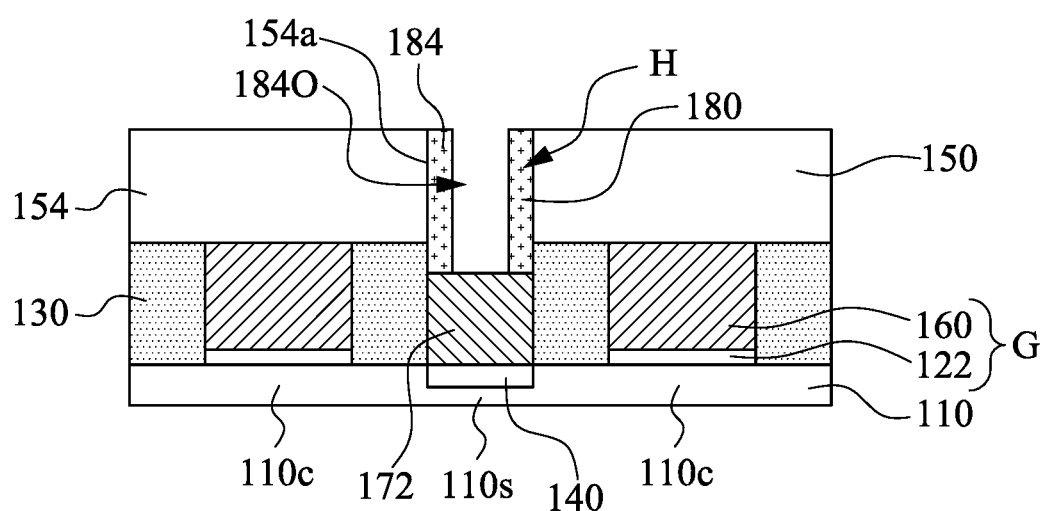

Reference is made to FIG. 12. The bottom horizontal portion 182 and the top horizontal portion 186 of the dielectric layer 180 (as shown in FIG. 11) are removed by an etching process, such as a dry etching, a wet etching, and/or other etching methods (e.g., reactive ion etching). The hole liner 184 of the dielectric layer 180 remains on the sidewall 154a of the second ILD layer 154 and over the source/drain contact 172. The remaining hole liner 184 has a bottom surface in contact with the source/drain contact 172, and hence the bottom surface of the hole liner 184 is in a position lower than top surfaces of the gate electrodes 160. The remaining hole liner 184 defines an opening 1840 to expose a portion of the source/drain contact 172. Bottom and top surfaces of the source/drain contact 172 are respectively in contact with the epitaxy feature 140 and the hole liner 184.

In some embodiments, an anisotropic etching process may be performed. In some embodiments, the etching process includes reacting an etchant with the dielectric layer 180, in which the etchant has high selectivity between the second ILD layer 154 and the dielectric layer 180. In other words, the second ILD layer 154 and the dielectric layer 180 have different etch resistance properties. For example, the second ILD layer 154 has higher etch resistance to the etchant used to etch the dielectric layer 180 than that of the dielectric layer 180.

Figure 13:
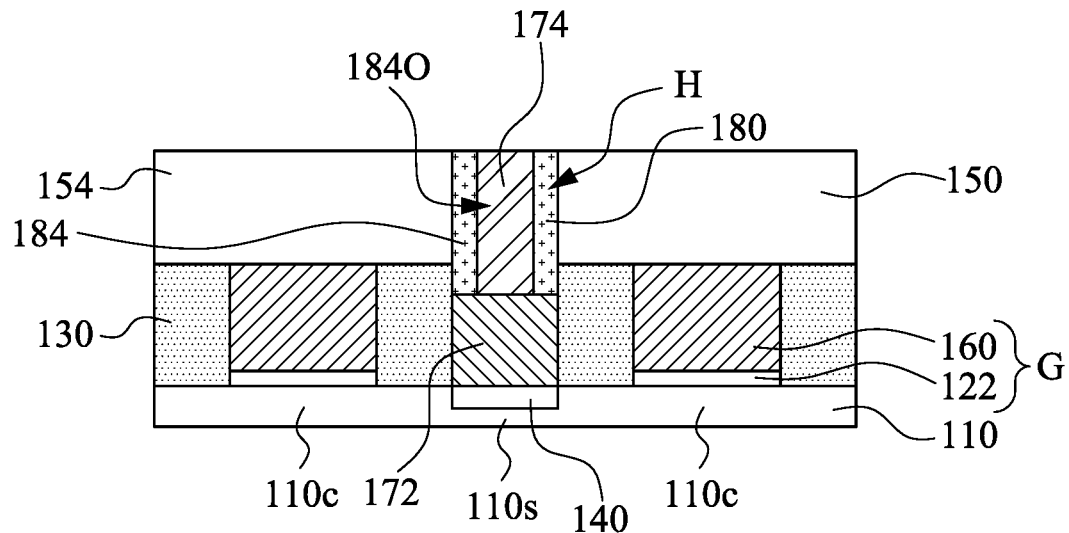

Next, a conductive structure 174 is formed in the contact hole H and in contact with the source/drain contact 172, and a CMP process is carried out to planarize the conductive structure with top surfaces of the second ILD layer 154 and of the dielectric layer 180. The resulting structure is shown in FIG. 13. To be specific, the conductive structure 174 is formed in the opening 184O defined by the hole liner 184, such that the hole liner 184 surrounds and is in contact with the conductive structure 174. The hole liner 184 thus separates the conductive structure 174 from the second ILD layer 154. In the cross-sectional illustration, there are hole liners 184 respectively in contact with opposed sidewalls of the hole H and arranged on the top surface of the source/drain contact 172 in a spaced-apart manner, and the conductive structure 174 is formed between the hole liners 184.

In illustrated embodiments, a bottom surface of the hole liner 184 is lower than top surfaces of the gate electrodes 160, and a top end of the hole liner 184 is substantially level with a top surface of the conductive structure 174. Because of the hole liner 184, a width of the conductive structure 174 is less than a width of the source/drain contact 172. Exemplary formation method of the conductive structure 174 may include depositing metal or other suitable conductive materials in the source/drain contact hole O1 using a deposition process, such as a CVD process.

Figure 14:
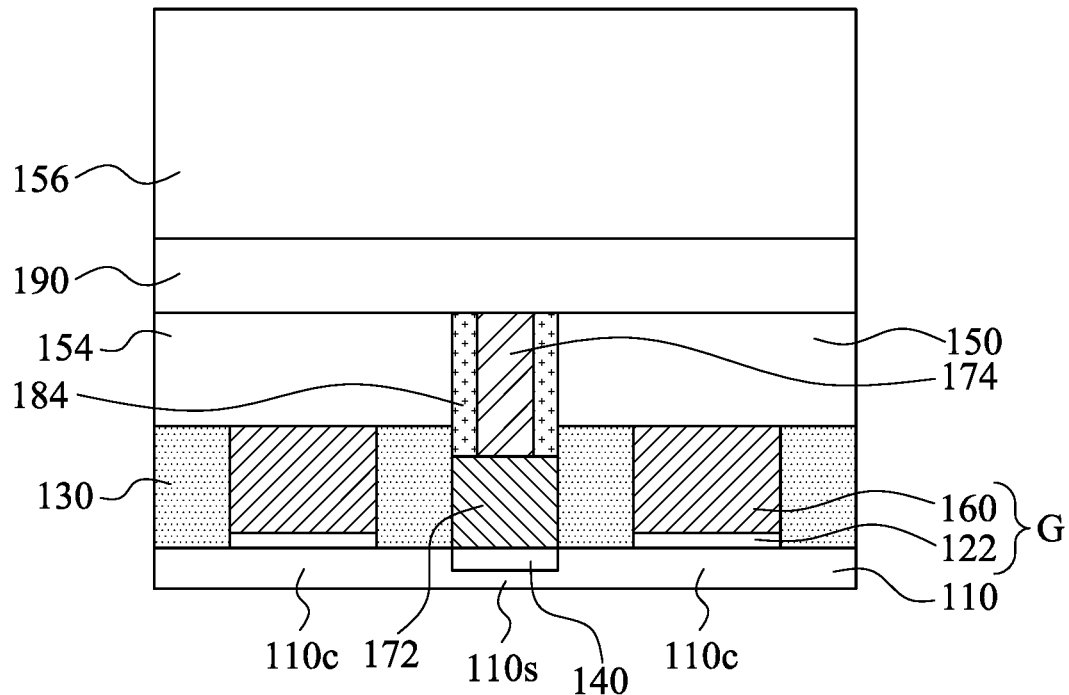

Reference is made to FIG. 14. An etch stop layer 190 is formed over the second ILD layer 154 and the conductive structure 174. The etch stop layer 190 may include a dielectric material, such as SiN, SiC, SiCN, SiON, the like, or combinations thereof. In some embodiments, the etch stop layer 190 may include material the same as that of the hole liner 184 and/or that of the gate spacers 130. In some embodiments, the etch stop layer 190 may be deposited using chemical vapor deposition (CVD), high density plasma (HDP) CVD, sub-atmospheric CVD (SACVD), molecular layer deposition (MLD), sputtering, physical vapor deposition (PVD), plating, or other suitable techniques.

In some embodiments, a thickness of the etch stop layer 190 is greater than that of the hole liner 184. For example, the thickness of the etch stop layer 190 is in a range of 5 nanometers to 50 nanometers. In some embodiments, the etch stop layer 190 is a SiN layer formed in the temperature range from about 250° C. to about 500° C. with a precursor of DCS/NH$_3$. In some embodiments, the etch stop layer 190 is a SiC layer formed in the temperature range from about 200° C. to about 450° C. with a precursor containing Si—C. In some embodiments, the etch stop layer is a SiON layer formed in the temperature range from about 200° C. to about 450° C. with a precursor of SiH$_4$/N$_2$O. In some embodiments, the etch stop layer 190 is a SiCN layer formed in the temperature range from about 200° C. to about 450° C. with a precursor containing Si—C or N reaction gas.

Then, a third ILD layer 156 is formed over the etch stop layer 190. In some embodiments, the third ILD layer 156 may include material the same as that of the second ILD layer 154 and/or that of the first dielectric layer 152 (as shown in FIG. 7). The third ILD layer 156 may be composed of any suitable dielectric or insulating material such as, but not limited to, silicon dioxide, SiOF, carbon-doped oxide, a glass or polymer material. For example, the dielectric material of the third ILD layer 156 may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, the like, or combinations thereof. The ELK dielectric material has a dielectric constant less than, for example, about 2.5. It is understood that the third ILD layer 156 may include one or more dielectric materials and/or one or more dielectric layers. In some embodiments, the third ILD layer 156 may be deposited by chemical vapor deposition (CVD), high density plasma (HDP) CVD, sub-atmospheric CVD (SACVD), spin-on coating, sputtering, or other suitable techniques. In some other embodiments, the third ILD layer 156 may include multiple layers of the same or differing dielectric materials may instead be used.

Figure 15:
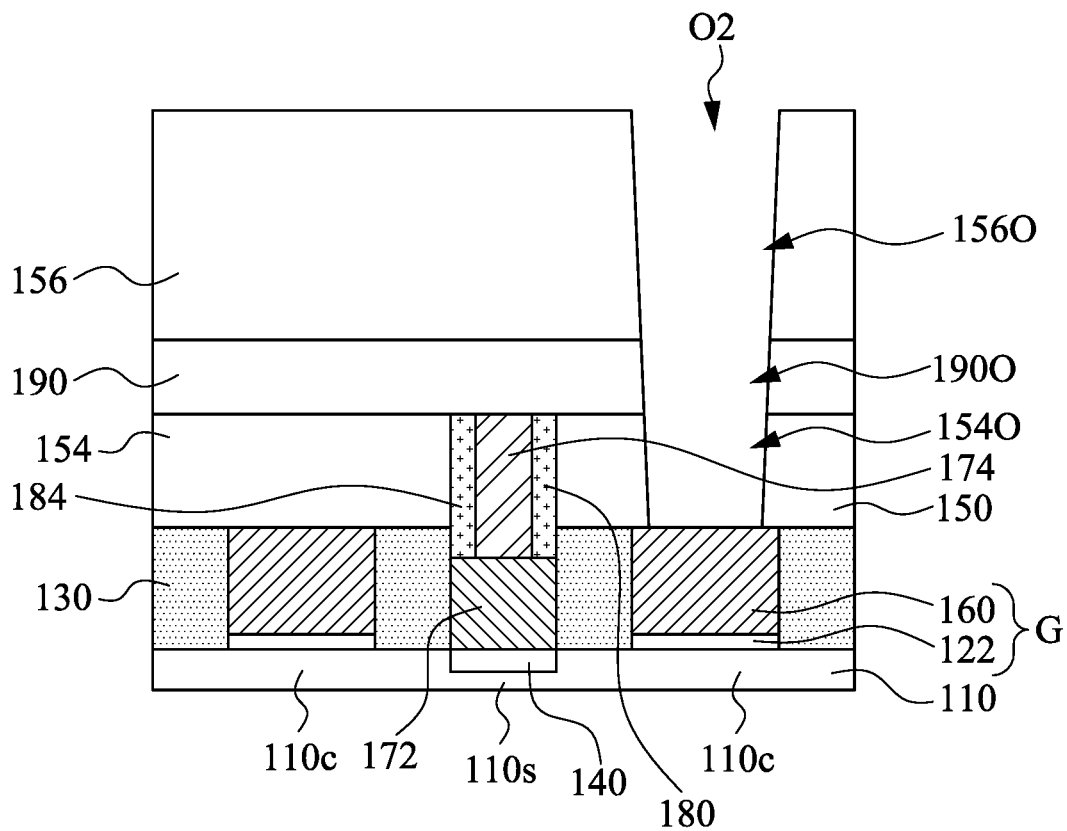

Reference is made to FIG. 15. A gate contact hole O2 is formed in the third ILD layer 156, the etch stop layer 190 and the second ILD layer 154 until reaching one or more gate electrodes 160, such that the one or more gate electrodes 160 are exposed. The gate contact hole O2 may be formed by one or more etching processes. The one or more etching processes stops at the top surface of the gate electrode 160. Since the top surface of the gate electrode 160 is in a position higher than a bottom of the hole liner 184, a bottom of the gate contact hole O2 may be in a position higher than the bottom of the hole liner 184 as illustrated. For example, a first opening 156O is etched in the third ILD layer 156 using a first etching process. In some embodiments, the etch stop layer 190 may has higher etch resistance to the first etching process than that of the third ILD layer 156. A second opening 190O is etched in the etch stop layer 190 through the first opening 156O using a second etching process. A third opening 154O is etched in the second ILD layer 154 through the first opening 156O and the second opening 190O using a third etching process. The first to third openings 156O, 190O, and 154O are spatially communicated to form the gate contact hole O2. Etchant used in the first to third etching processes may be different. For example, the first and third etching process may use an etchant such as dilute hydrofluoric acid (HF), HF vapor, CF$_4$, C$_4$F$_8$, CH$_x$F$_y$, C$_x$F$_y$, SF$_6$, or NF$_3$ gas, and the second etching process may use an etchant such as CH$_2$F$_2$ or other applicable etchants. In some embodiments, the hole liner 184 has higher etch resistance to the first etching process than that of the third ILD layer 156, and the conductive structure 174 is thus protected from the first etching process by hole liner 184. In some embodiments, the hole liner 184 has higher etch resistance to the second etching process than that of the etch stop layer 190, and the conductive structure 174 is thus protected from the second etching process by hole liner 184. In some embodiments, the hole liner 184 has higher etch resistance to the third etching process than that of the second ILD layer 154, and the conductive structure 174 is thus protected from the third etching process by the hole liner 184. Since the hole liner 184 protects the conductive structure 174 from one or more etch processes for forming the gate contact hole O2, process window of lithography and/or etch processes for forming the gate contact hole O2 can be relaxed. Therefore, an enlarged gate contact hole O2 can be formed over the gate G.

Figure 16:
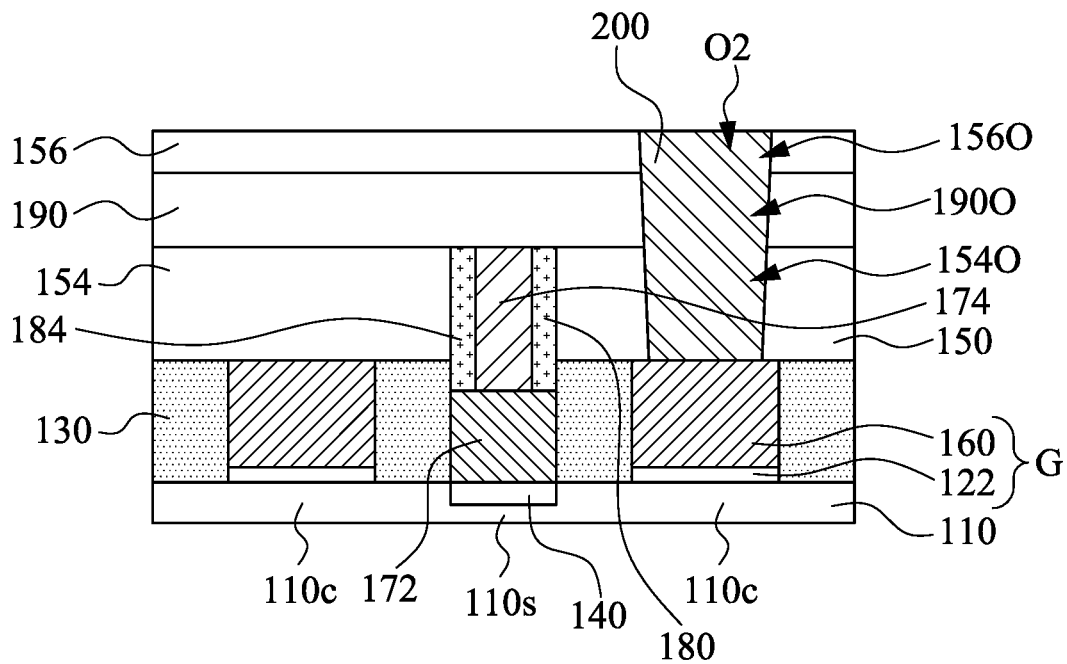

Reference is made to FIG. 16. A gate contact 200 is formed in the gate contact hole O2. In illustration, the hole liner 184 is between the conductive structure 174 and the gate contact 200, and the ILD layer 154 is between the hole liner 184 and the gate contact 200. The gate contact 200 is a conductor, such as aluminum, aluminum copper or copper. For example, a conductive layer may be deposited over the ILD layer 156 and filling the gate contact hole O2, an excess portion of the conductive layer outside the gate contact hole O2 is removed, using for example, a CMP process, and thereby forming the gate contact 200. The conductive layer may be formed, for example, by PVD, CVD, ALD, electroplating (ECP) step, a chemical electroless deposition (ELD), or various combinations thereof. As aforementioned, an enlarged gate contact hole O2 can be provided because the conductive structure 174 is protected from the etching the gate contact hole O2, and hence an enlarged gate contact 200 can be formed in such an enlarged gate contact hole O2, which is advantageous for reduction of contact resistance between the gate contact 200 and the gate electrode 160.

Based on the above discussions, it can be seen that the present disclosure offers advantages over interconnection structures. It is understood, however, that other embodiments may offer additional advantages, and not all advantages are necessarily disclosed herein, and that no particular advantage is required for all embodiments. One advantage is that an undesirable electrical connection between the gate contact and the source/drain contact can be prevented because the hole liner protects the conductive structure over the source/drain contact against etching the gate contact hole. Another advantage is that the process window for forming gate contact holes can be relaxed. Yet another advantage is that the gate contact hole and the gate contact can be enlarged and thus reduce the gate contact resistance.

According to some embodiments of the present disclosure, a method includes forming an ILD structure over a source/drain region, forming a source/drain contact in the ILD structure and over the source/drain region, removing a portion of the source/drain contact such that a hole is formed in the ILD structure and over a remaining portion of the source/drain contact, forming at least one hole liner lining at least one sidewall of the hole after removing the portion of the source/drain contact, and forming a conductive structure in the hole.

According to some embodiments of the present disclosure, a method includes forming an interlayer dielectric (ILD) structure over a source/drain region, forming a source/drain contact over the source/drain region and penetrating through the ILD structure, etching back the source/drain contact such that a hole is formed in the ILD structure, forming a hole liner along a sidewall of the hole after etching back the source/drain contact, and forming a conductive structure such that the hole liner is between the conductive structure and the ILD structure.

According to some embodiments of the present disclosure, a method includes forming an interlayer dielectric (ILD) structure over a source/drain region; etching a hole in the ILD structure over the source/drain region; forming a source/drain contact over the source/drain region in the hole in the ILD structure; planarizing a top surface of the source/drain contact with a top surface of the ILD structure; etching back the source/drain contact such that the top surface of the source/drain contact is lower than the top surface of the ILD structure; depositing a conductive material in the hole in the ILD structure and over the top surface of the source/drain contact after etching back the source/drain contact; and planarizing a top surface of the conductive material with the top surface of the ILD structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an interlayer dielectric (ILD) structure over a source/drain region and a gate stack, wherein the gate stack comprises a gate dielectric layer and a gate electrode over the gate dielectric layer;
    forming a source/drain contact in the ILD structure and over the source/drain region;
    removing a portion of the source/drain contact such that a first hole is formed in the ILD structure and over a remaining portion of the source/drain contact;
    forming at least one hole liner lining at least one sidewall of the first hole after removing the portion of the source/drain contact;
    forming a conductive structure in the first hole;
    after forming the conductive structure, etching the ILD structure to form a second hole that exposes a top surface of the gate electrode; and
    filling the second hole with a conductor to form a gate contact over the top surface of the gate electrode.

2. The method of claim 1, wherein the forming the hole liner comprises:
    forming a dielectric layer over the remaining portion of the source/drain contact and along the sidewall of the first hole; and
    removing a portion of the dielectric layer over the remaining portion of the source/drain contact.

3. The method of claim 1, wherein forming the hole liner is performed such that a bottom surface of the hole liner is in contact with the remaining portion of the source/drain contact.

4. The method of claim 1, wherein forming the conductive structure is performed such that a sidewall of the conductive structure is in contact with the hole liner.

5. The method of claim 1, wherein removing the portion of the source/drain contact is performed such that a top surface of the remaining portion of the source/drain contact is in a position lower than the top surface of the gate electrode.

6. The method of claim 5, wherein forming the hole liner is performed such that a bottom surface of the hole liner is in contact with the top surface of the remaining portion of the source/drain contact.

7. The method of claim 1, wherein forming the conductive structure is performed such that a width of the conductive structure is less than a width of the source/drain contact.

8. The method of claim 1, wherein forming the hole liner is performed such that a plurality of the hole liners are respectively in contact with a plurality of the sidewalls of the first hole, wherein forming the conductive structure is performed such that the conductive structure is between the hole liners, and the hole liners are formed on a top surface of the remaining portion of the source/drain contact in a spaced-apart manner.

9. The method of claim 1,
wherein the hole liner has higher etch resistance to etching the ILD structure than that of the ILD structure.

10. A method, comprising:
forming an interlayer dielectric (ILD) structure over a source/drain region and a gate stack, wherein the gate stack comprises a gate dielectric layer and a gate electrode over the gate dielectric layer;
forming a source/drain contact over the source/drain region, the source/drain contact penetrating through the ILD structure;
etching back the source/drain contact such that a hole is formed in the ILD structure;
forming a dielectric hole liner along a sidewall of the hole after etching back the source/drain contact;
forming a conductive structure such that the dielectric hole liner is between the conductive structure and the ILD structure; and
forming a gate contact in the ILD structure and over the gate electrode, wherein the gate contact is electrically isolated from the conductive structure at least by the dielectric hole liner.

11. The method of claim 10, wherein the source/drain contact is etched back until reaching a position lower than a top surface of the gate electrode proximate the source/drain region.

12. The method of claim 11, wherein forming the dielectric hole liner is performed such that a bottom surface of the dielectric hole liner is in a position lower than the top surface of the gate electrode.

13. The method of claim 10, wherein the ILD structure has higher etch resistance to the etching back than that of the source/drain contact.

14. The method of claim 10, further comprising:
forming in sequence an etch stop layer and an ILD layer over the ILD structure; and
etching a gate contact hole in the ILD layer, the etch stop layer and the ILD structure until reaching the gate electrode prior to forming the gate contact, wherein the dielectric hole liner has higher etch resistance to etching the gate contact hole than that of the ILD structure, and forming the gate contact is performed such that the gate contact is formed in the gate contact hole.

15. The method of claim 10, wherein forming the gate contact is performed such that the dielectric hole liner spaces the conductive structure apart from the gate contact.

16. The method of claim 14, wherein etching the gate contact hole is performed such that a bottom of the gate contact hole is in a position higher than a bottom of the dielectric hole liner.

17. A method, comprising:
forming an interlayer dielectric (ILD) structure over a gate stack, a gate spacer, and a source/drain region, wherein the gate spacer extends along sidewalls of the gate stack;
etching a hole in the ILD structure over the source/drain region;
forming a source/drain contact over the source/drain region in the hole in the ILD structure;
planarizing a top surface of the source/drain contact with a top surface of the ILD structure, wherein the planarized top surface of the source/drain contact is higher than a top end of the gate spacer after planarizing the top surface of the source/drain contact;
etching back the source/drain contact such that the top surface of the source/drain contact is lower than the top surface of the ILD structure;
depositing a conductive material in the hole in the ILD structure and over the top surface of the source/drain contact after etching back the source/drain contact; and
planarizing a top surface of the conductive material with the top surface of the ILD structure.

18. The method of claim 17, further comprising:
forming a hole liner in the hole in the ILD structure after etching back the source/drain contact.

19. The method of claim 18, wherein forming the hole liner comprises:
depositing a liner material over the top surface of the ILD structure, the top surface of the source/drain contact, and sidewalls of the hole in the ILD structure; and
removing portions of the liner material over the top surface of the ILD structure and over the top surface of the source/drain contact.

20. The method of claim 17, where etching back the source/drain contact is performed such that a topmost portion of the top surface of the source/drain contact is lower than the top end of the gate spacer.

* * * * *